United States Patent [19]

Mashikian et al.

[11] Patent Number: 5,530,364
[45] Date of Patent: Jun. 25, 1996

[54] CABLE PARTIAL DISCHARGE LOCATION POINTER

[75] Inventors: Matthew S. Mashikian; Zhifang Du; Paul S. Mashikian, all of Storrs, Conn.

[73] Assignee: The University of Connecticut, Storrs, Conn.

[21] Appl. No.: 364,550

[22] Filed: Dec. 27, 1994

[51] Int. Cl.⁶ ................................................. G01R 31/08
[52] U.S. Cl. ..................... 324/529; 324/530; 324/242; 324/536
[58] Field of Search .......................... 324/529, 530, 324/67, 241, 242, 263, 536

[56] References Cited

U.S. PATENT DOCUMENTS

| 4,370,610 | 1/1983 | Allen | 324/529 |
|---|---|---|---|
| 4,446,420 | 5/1984 | Drouet | 324/529 |
| 4,884,034 | 11/1989 | Guzman | 324/529 |
| 4,887,041 | 12/1989 | Mashikian et al. | |
| 5,272,439 | 12/1993 | Mashikian et al. | |

FOREIGN PATENT DOCUMENTS

| 034169 | 2/1984 | Japan | 324/529 |
|---|---|---|---|
| 0126169 | 5/1990 | Japan | 324/529 |
| 4-297878 | 10/1992 | Japan | 324/529 |
| 842641 | 6/1981 | U.S.S.R. | 324/529 |
| 1095113 | 5/1984 | U.S.S.R. | 324/529 |
| 383439 | 11/1932 | United Kingdom | 324/529 |

*Primary Examiner*—Kenneth A. Wieder
*Assistant Examiner*—Jose M. Solis
*Attorney, Agent, or Firm*—Pepe & Hazard

[57] ABSTRACT

A method and apparatus for detecting the location of an incipient fault in an insulated power which includes the application of an excitation voltage to a power line to produce a partial discharge signal pulse at a fault along the power line. The surface of the power line is scanned with two axially spaced sensors disposed adjacent the surface of the power line, the sensors detecting the partial discharge signal pulse to produce discrete detected pulses. These detected pulses are combined to produce a combined signal having all amplitude level which reaches an extreme value when the fault is located equidistantly between the sensors. The sensors are moved along the power line until the fault is located substantially equidistantly between the sensors as indicated by the extreme amplitude level of the combined signal.

23 Claims, 7 Drawing Sheets

CABLE PARTIAL DISCHARGE LOCATION POINTER

BACKGROUND OF THE INVENTION

The present invention relates to methods and apparatus for locating incipient faults in electric power distribution cables.

As discussed at length in U.S. Pat. No. 4,887,041 granted Dec. 12, 1989 to Matthew S. Mashikian, Robert B. Northrop, Rajeev Bansal and Chrysostomos L. Nikias and entitled "Method and Instrumentation for the Detection, Location and Characterization of Partial Discharges and Faults in Electric Power Cables", and U.S. Pat. No. 5,272,439 granted Dec. 21, 1993 to Matthew S. Mashikian, Robert B. Northop, Rajeev Bansal, and Francesco Palmieri entitled "Method and Apparatus for the Detection and Location of Faults in Partial Discharges in Shielded Cables", insulated underground power cables are extensively used to distribute electrical energy. Power cables which are used at elevated voltages, basically consist of a central conductor surrounded by a thin concentric layer of a semi-conducting material which is referred to as a conductor shield, a concentric layer of insulating material such as oil impregnated paper, polyethylene, or other polymer, and a second concentric semi-conducting layer referred to as an insulation shield, and a metal conductor applied in the form of a thin helically wound concentric cylindrical wires, flat metal straps, or overlapping flat metal tapes which provide a ground or neutral. This assembly may be covered by a thin electrically insulating or semiconducting jacket. Power cables designed to operate below three thousand volts and communication cables may omit semi-conducting shields and neutrals.

As discussed in the aforementioned patents, such insulated cables are intended to operate safely and effectively over lifespans exceeding thirty years. However, because of manufacturing defects, installation errors, or aging under adverse conditions, cables may develop incipient faults which are evidenced by a "partial discharge" (PD) at the point of the incipient fault. Because of a defect developing within or adjacent to the insulation of a cable, intermittent arcing (partial discharge) occurs within the insulation. As used herein, the term "incipient fault" refers to a fault within the cable which will not cause immediate failure but which may lead to eventual failure, and the term "partial discharge" refers to the intermittent arcing which will occur at such a point particularly when a large excitation voltage is applied to the line. The energy involved in this partial discharge is extremely small, and, depending upon the type of insulating material, localized deterioration of the material occurs. Eventually, such incipient faults will produce a complete breakdown of the cable. Should this occur during a critical period, such as during a period of peak demand, there can be considerable customer inconvenience.

The location of faults in power lines has been the subject matter of prior patents and various technical papers. U.S. Pat. No. 2,628,267 measures the time of arrival of surge currents and reflections emanating from a ground along the cable. U.S. Pat. Nos. 3,244,975 and 3,255,406 disclose what is referred to as an impulse reflection method of testing cables where the time difference of detection of transmitted and reflected pulses are measured to determine fault location. U.S. Pat. No. 4,104,582 measures the time by clocking a counter. U.S. Pat. No. 4,491,782 discloses a technique of recording impulse reflection where impulse reflection signals are measured during normal operation and also under fault conditions, and it makes a comparison after fault occurs to determine the location of the fault in a cable.

In the aforementioned Mashikian et al U.S. Pat. No. 4,887,041, there is disclosed apparatus and methods for locating an incipient fault along a power transmission line using filters and amplification to modify the high frequency pulses on the line resulting from an excitation voltage. These modified pulses are converted into digital data interpreted by a computer to locate the point of the incipient fault along the length of the power line.

The aforementioned Mashikian et al U.S. Pat. No. 5,272,439, discloses apparatus and methods for detecting and approximating the position of an incipient fault in a power cable. This method includes additional filtering, amplification, data storage and processing steps to the method of the aforementioned Mashikian et al U.S. Pat. No. 4,887,041 in order to detect a partial discharge signal in an environment where it is obscured by electrical noise.

Although both the methods and apparatuses of the aforementioned Mashikian et al U.S. patents are effective, their degree of accuracy in locating a partial discharge site is only within plus or minus two feet. This degree of accuracy, however, is generally insufficient since cable repair normally requires that the site of the defect be known within approximately six inches.

It is an object of the present invention to provide a novel method and apparatus for detecting and approximating the position of an incipient fault in an electrical power transmission line accurately enough to locate the site of the defect to within the distance normally required by cable repair.

It is also an object to provide a novel apparatus for practicing the method which will function effectively when the power cable neutral is either in the form of thin helically wound concentric cylindrical wires or flat metal strips.

Another object is to provide a method which is nondestructive, rapidly employed and reasonably accurate.

A further object is to provide a novel apparatus for practicing the method which is relatively easily transported and operated.

SUMMARY OF THE INVENTION

It has now been found that the foregoing and related objects may be readily attained in a method for detecting the location of an incipient fault in an insulated power which includes the application an excitation voltage to a power line to produce a partial discharge signal pulse at a fault along the power line. The surface of the power line is scanned with two axially spaced sensors disposed adjacent the surface of the power line which detects the partial discharge signal pulse to produce discrete detected pulses. These detected pulses are combined to produce a combined signal having an amplitude level which reaches an extreme value when the fault is located equidistantly between the sensors. The sensors are moved along the power line until the fault is located substantially equidistantly between the sensors as indicated by the extreme amplitude level of the combined signal.

In one embodiment of the method, the amplitude level of the combined signal is compared with a predetermined signal amplitude level, and a comparison output signal is produced if the amplitude level of the combined signal equals or exceeds the predetermined signal amplitude level.

Generally, the pulses detected by the sensors are voltage pulses. When the pulses detected by the sensors are current pulses, these current pulses are converted to discrete voltage pulses by a transresistance circuit.

The pulses detected by the sensors are of opposite polarity when the fault is located between the sensors. The pulses detected by one sensor are subtracted from the pulses detected by the other sensor to produce a combined signal. This combined signal is then passed through a high pass filter that rejects any frequencies lower than a predetermined frequency level to produce a filtered signal which is then amplified.

The apparatus for detecting the location of the incipient fault includes means for applying an excitation voltage to the power line to produce a partial discharge signal pulse at a fault along the power line, and means for scanning the surface of the power line which includes two spaced sensors disposed in axially spaced relationship adjacent the surface of the power line to detect the partial discharge signal pulses and produce discrete detected pulses. Means for combining the detected pulses produces a combined signal having an amplitude level which reaches an extreme value when the fault is located equidistantly between the sensors.

There is also provided means for comparing the amplitude level of the combined signal with a predetermined signal amplitude level, means for producing a comparison output signal if the amplitude level of the combined signal equals or exceeds the predetermined signal amplitude level, and a signalling device operable by the comparison output signal.

In one embodiment of the apparatus, the sensors are of arcuate configuration providing ends and dimensioned to partially encircle the periphery of the power line. Each of these sensors include a layer of insulating material to be disposed adjacent the surface of the power line, a layer of electrically conducting material disposed upon the insulating layer, two electrical output terminals, and means for releasably electrically connecting the ends of each of the sensors together to encircle the periphery of the power line whereby the partial discharge pulse induces a current in the conducting layer that may be conducted from the output terminals. The induced current conducted from the output terminals is then converted to a voltage.

Generally, the layer of electrically conducting material includes a multiplicity of axially spaced wire loops, which are connected, and the sensors are configured to dispose the axially spaced wire loops substantially concentrically with the center of the power line. Alternatively, the layer of electrically conducting material includes a flexible sheet of electrical conducting material and the sensor is configured to dispose the sheet substantially concentrically with the center of the power line. In addition, a layer of magnetic material may be disposed between the layer of electrically conducting material and the power line.

In another embodiment of the apparatus, the sensors include a core having magnetic properties, and an electrical conductor disposed upon the core. The partial discharge pulse will create a residual magnetic field outside the power line, and the residual magnetic field will produce a magnetic flux in the core of the sensor which induces a voltage in the electrical conductor which appears across the terminals of the sensor.

Preferably, the means for combining the detected pulses includes a differential amplifier for subtracting one of the detected pulses from the other of the detected pulses to produce the combined signal, and a high pass filter is connected to the differential amplifier and through which the combined signal is passed. The filter rejects any frequencies lower than a predetermined frequency level and produces a filtered signal, which is passed to an amplifier for amplifying the filtered signal to produce an amplified signal. The common mode noise signal coming into the two sensors are cancelled.

The means for producing a comparison output signal generally includes first and second comparitors, the first comparitor producing the comparison output signal if the amplitude level of the combined signal is negative and exceeds a negative predetermined signal amplitude level. The second comparator produces a comparison output signal if the amplitude level of the combined signal is positive and exceeds a positive predetermined signal amplitude level.

In addition, the signalling device generally includes first and second multivibrators, with the first multivibrator being operated by the comparison output signal of the first comparator, and the second multivibrator being operated by the second comparator output signal. The multivibrators, in turn, actuate first and second light emitting diodes which, respectively, are actuated by the first and second multivibrators.

The signalling device desirably also includes a multivibrator operated by the comparison output signal which actuates an audio beeper.

DETAILED DESCRIPTION OF THE PREFERRED EMBODIMENT

In the aforementioned Mashikian et al U.S. Pat. Nos. 4,887,041 and 5,272,439, there has been described in detail apparatus for generating an excitation signal and processing a partial discharge signal which is detected in the power line following the excitation signal. The relevant operation is disclosed in these patents and incorporated herein by reference. The following description concentrates on a sensing method and apparatus which enable detection of the exact location of the incipient fault which has been approximated by the method and apparatus of the aforementioned patents.

Figure 1:
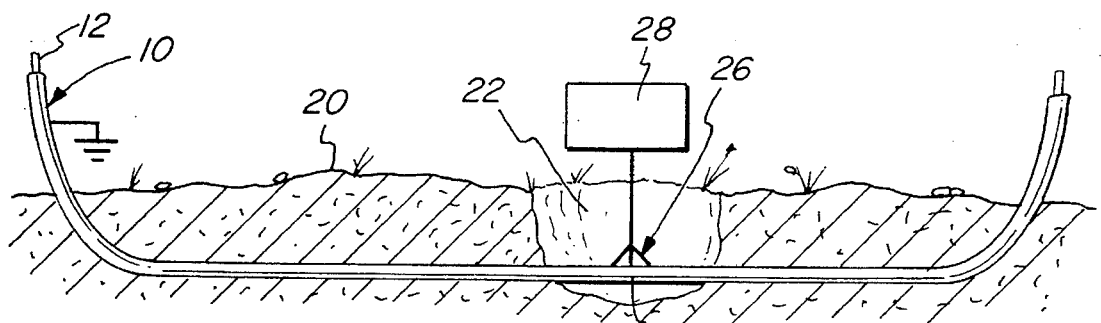
FIG. 1 is a diagrammatical view of the apparatus of the present invention disposed on an inground insulated power line to detect the location of an incipient fault.

Turning first to FIG. 1, therein schematically illustrated is a sensor being used to detect the fault location in accordance with the present invention. The general location of a partial discharge (PD) fault site 24 is first determined within plus or minus two feet by the method and apparatus of the aforementioned Mashikian et al U.S. Pat. Nos. 4,887,041 and 5,272,439. This approximation desirably includes the use of the position locator antenna of the latter patent. The antenna is moved along the ground to determine the approximate position of the fault. In order to repair the inground power line generally designated by the numeral 10, a trench 22, approximately eight to ten feet long, is dug in the ground 20 until the power line 10 is exposed. As will be appreciated, the approximation of position is along the length of the power line 10 which may not be straight. An excitation voltage source (not shown) is again connected to a power line conductor 12 at an open end of the power line 10. Since the methods and apparatus of the aforementioned Mashikian et al U.S. Pat. Nos. 4,887,041 and 5,272,439 only determine the PD site 24 to within plus or minus two feet, the method and apparatus of the present must be subsequently used to determine more precisely the PD site 24

According to the method of the present invention, the surface of the power line 10 is scanned by a pointer apparatus embodying the present invention generally designated by the numeral 26, until a display 28 indicates that the pointer 26 is centered on the PD site 24. This method and apparatus enable the location of the PD site 24 to be determined within an accuracy of plus or minus two inches.

Figure 2:
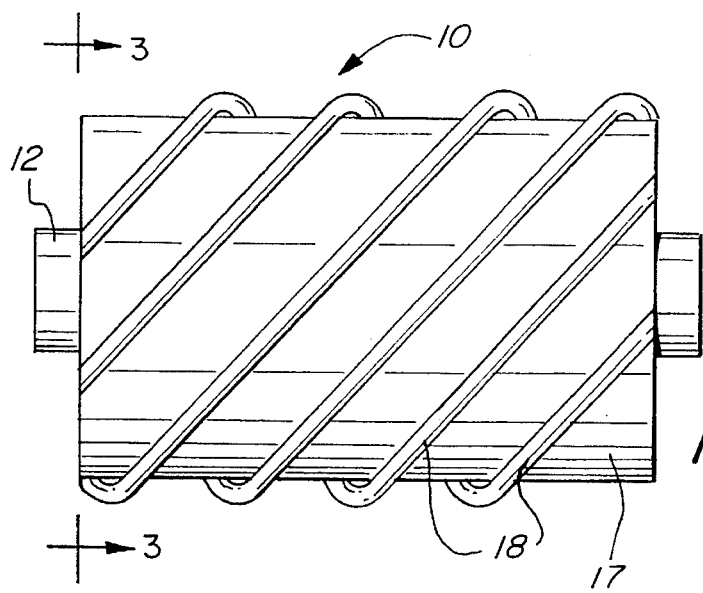
FIG. 2 is a fragmentary side elevational view in partial section of a typical inground power line.
Figure 3:
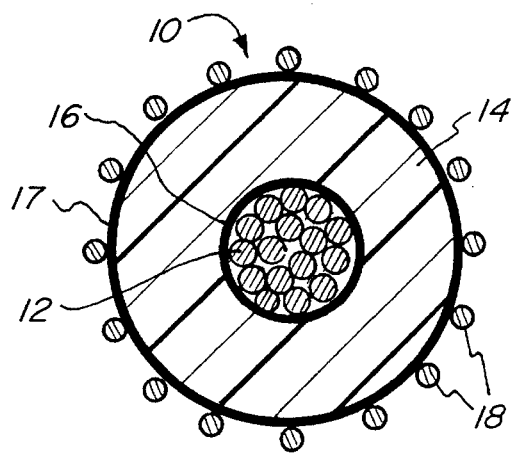
FIG. 3 is a sectional view along the line 3—3 of FIG. 2.

Reference is briefly made to FIGS. 2 and 3 which exemplify the construction of a typical modern inground power line 10. A copper or aluminum conductor 12 (usually stranded) is at the center of the power line 10 and is surrounded by a thin layer of semiconducting plastic material providing a conductor shield 16. The conductor shield 16 is surrounded by an extruded layer of plastic insulation 14 which, in turn, is shielded with a thin layer of semiconducting material which functions as an insulation shield 17. Neutral copper conducting wires 18 are helically wound over the insulation shield 17.

In certain cable constructions, flat copper strap, or thin copper, or aluminum tape, or laminates (not shown) are used as the neutral\s in place of the helical wire 18. One common important characteristic for all of these cables is their lack of complete tightness with respect to electromagnetic fields. In other words, if a current circulates in the central conductor 12, the return current will exist in the neutral 18. Although these currents will produce magnetic fields in opposite directions which tend to cancel each other, a net magnetic field nevertheless exists on the surface of the power line 10. The pointer 26 physically operates on the basis of this residual magnetic field.

Figure 4:
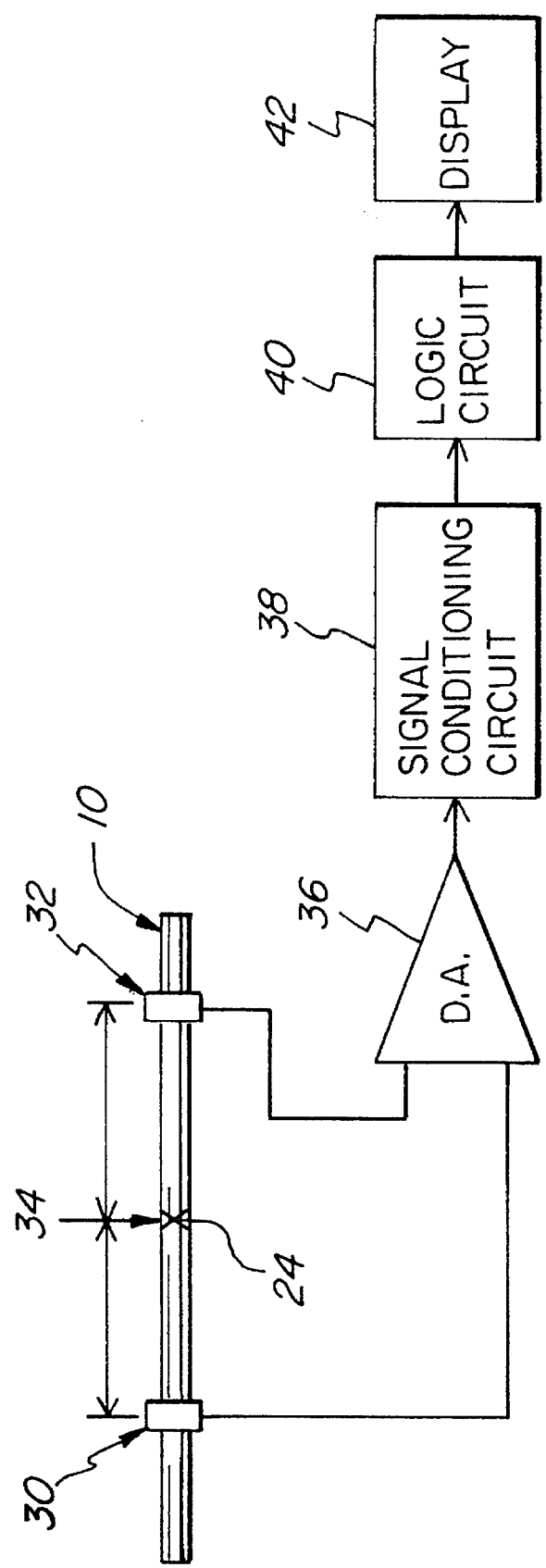
FIG. 4 is a schematic diagram of a sensor apparatus embodying the present invention as applied to a diagrammatically illustrated power line.

Reference is made to FIG. 4, which exemplifies the pointer 26 embodying the present invention. The pointer 26 consists of five major components: a pair of spaced sensors generally designated by the numerals 30 and 32, a differential amplifier, generally designated by the numeral 36, a signal conditioning circuit generally designated by the numeral 38, a logic circuit generally designated by the numeral 40, and a display generally designated by the numeral 42.

Figure 5:
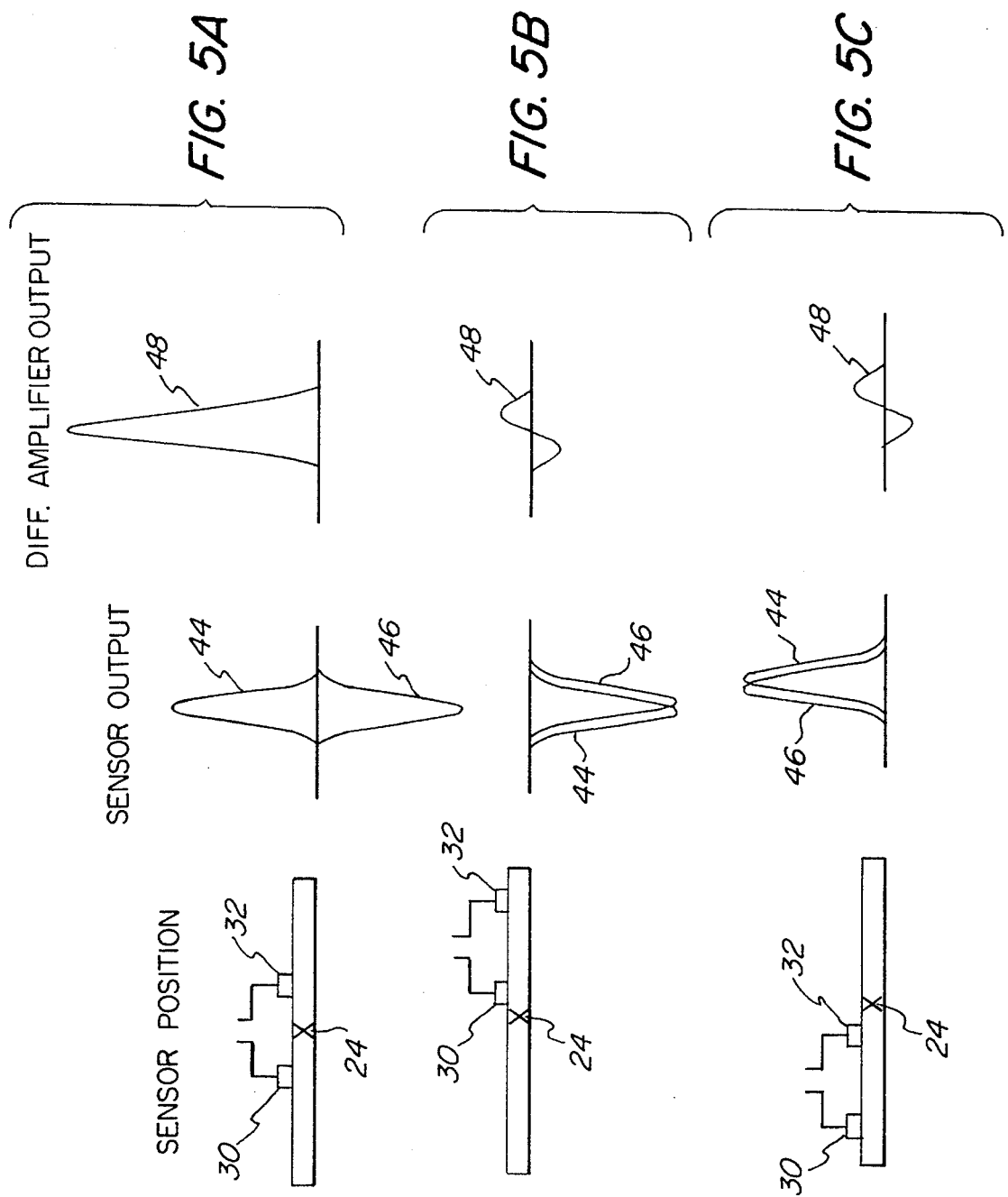
FIGS. 5A–5C are oscilloscope tracings of sensor and differential amplifier outputs based on the diagrammatically illustrated sensor positions with respect to an incipient fault.

The two sensors 30 and 32 are typically spaced six to twelve inches apart, and have the ability to convert the residual magnetic field outside the power line 10 to current or voltage pulses using the principle of electromagnetic induction. When the PD site 24 is between the sensors 30 and 32, the PD pulses travel in opposite directions away from the site 24. In this position, the sensors 30 and 32 are designed to induce voltage signals 44 and 46 of opposite polarity, respectively, as illustrated in FIG. 5a. The voltage signals 44 and 46 are fed into a differential amplifier 36 which subtracts voltage signal 46 from voltage signal 44. Thus, when the PD 24 site is between the sensors 30 and 32, the combined signal 48 is larger than the individual signals because the subtraction operation involves subtracting a negative quantity from a positive quantity, i.e., adding the two values. The combined signal 48 reaches its largest magnitude level when the PD site 24 is located equidistantly between the sensors 30 and 32.

When the PD site 24 is outside the span of the two sensors 30 and 32, the induced voltages 44 and 46 are of the same polarity, as illustrated in FIGS. 5b and 5c. When the signals 44 and 46 are subtracted from each other by the differential amplifier 36, the resulting combined signal 48 is much smaller than the combined signal 48 generated when the PD site 24 is between the sensors 30 and 32.

It is important to note that, in the absence of any PD signal, the noise signals appearing at the terminals of the sensors 30 and 32 are subtracted from each other in the differential amplifier 36 resulting in very effective noise cancellation. This effective noise cancellation is a direct result of the design of the apparatus of the present invention which utilizes two, instead of just one sensor.

As shown in FIG. 4, the output of the differential amplifier 36 is sent to a signal conditioning circuit 38 which filters out the small combined signal and amplifies the large combined signal. As a result, small signals due to noise are filtered and signals generated when the PD site is located are amplified. The output of a signal conditioning circuit 38 is then fed to a logic circuit 40 which operates an audible and visual display 42 to alert the operator to the exact location of the PD site 24.

When the pointer 26 scans the surface of the power line 10 during operation, a midspan position 34 between the sensors 30 and 32 is noted when the filtered signal 48 is first displayed and when the filtered signal 48 ceases to be displayed. The PD site 24 corresponds to the average of these two positions.

The location of the PD site 24 may also be verified by noting that the PD site 24 also corresponds to the position of the leading sensor 32 when the filtered signal 48 is first displayed or to the position of the trailing sensor 30 when the filtered signal 48 ceases to be displayed.

Figure 6:
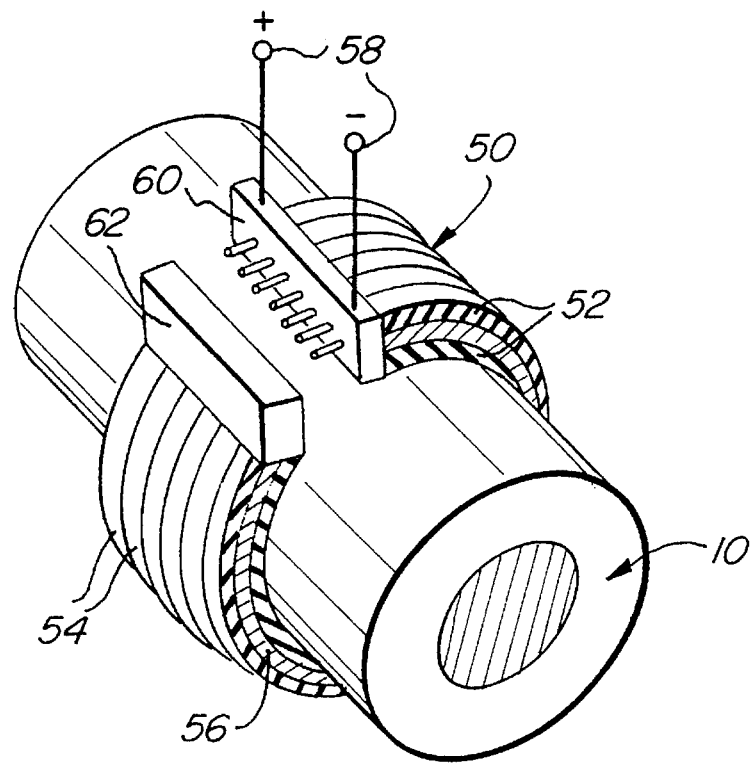
FIG. 6 is a perspective view in partial section of a current sensor embodying the present invention disposed about a fragmentary illustrated power line.

Turning next to the construction of sensors 30 and 32, two types have been found most effective: a current sensor and a magnetic induction sensor. As best illustrated in FIG. 6, a current sensor generally designated by the numeral 50 is of arcuate configuration and consists of ten to twenty arcuate lengths of insulated wire 54, disposed on a flexible insulating material 52. The ends of each length of the wires 54 are respectively soldered to the male and female halves 60 and 62 of a pin connector, allowing the sensor 50 to be opened like a bracelet and then closed around the power line 10 to provide an electrical connection.

Figure 8A:
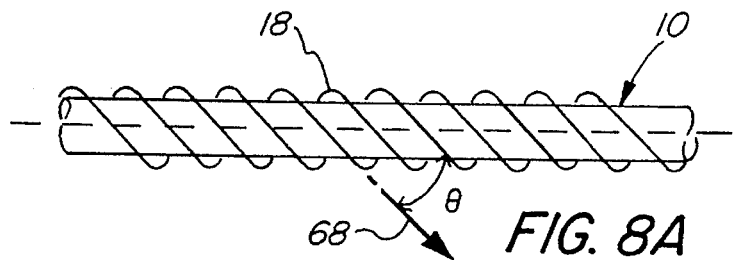
FIGS. 8A–8C are schematic illustrations of a power line, its associated magnetic field, and a current sensor about the power line, respectively.
Figure 8B:
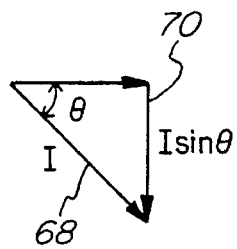
Figure 8C:
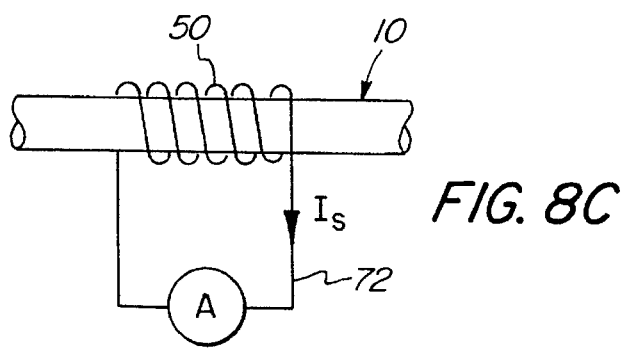

FIG. 8 shows a schematic illustration of the current sensor 50. A current pulse 68 in the concentric neutral wire 18 of the power line 10 induces a current 72 in the sensor wire 54 by the magnetic field associated with the radial component 70 of the current 68 as shown in FIGS. 8b and 8c. The current 72 is then conducted through output terminals 58 of the sensor 50 to which the wires 54 are connected.

Figure 11:
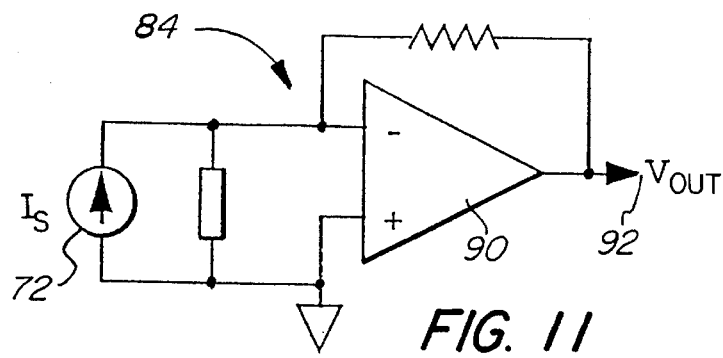
FIG. 11 is a schematic illustration of a transresistance circuit.

Turning next to the signal conditioning circuit 38, the current sensor 50 is connected to a transresistance circuit 84 as illustrated in FIG. 11 in order to change the current 72 induced in the sensor 50 into a voltage 92.

As best illustrated in FIG. 6, an optional embodiment of the sensor 50 includes a thin sheet of flexible magnetic material 56 around the inner diameter of the sensor 50. The magnetic sheet 56 increases the magnetic flux density through the wires 54 to improve the sensitivity of the sensor 50.

Figure 7:
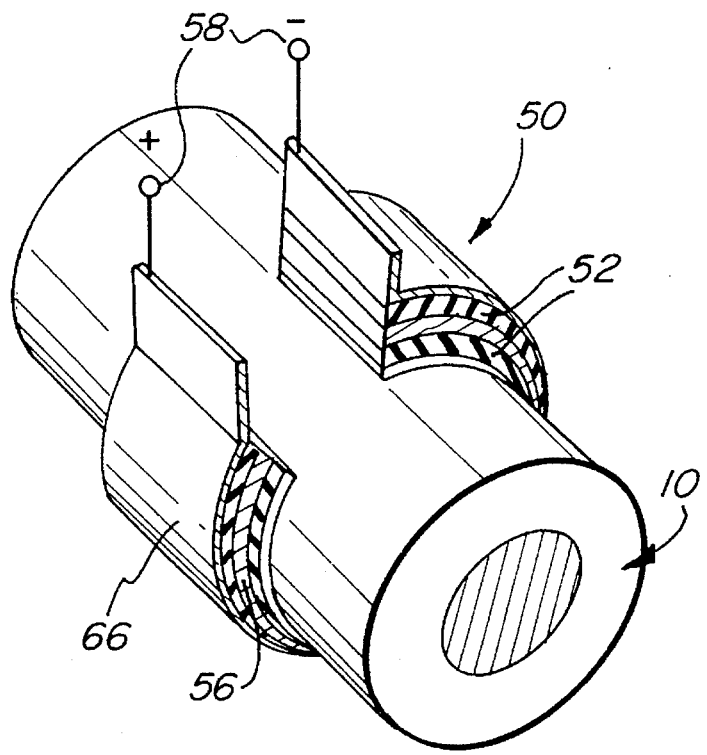
FIG. 7 is a similar view of another embodiment of the current sensor.

As illustrated in FIG. 7, the wires 54 of the current sensor 50 may be replaced by a single sheet 66 of a metal conductor, such as copper. Electrical terminals 58 are soldered at each of the two edges of the sheet 66 parallel to the axis of the power line 10.

Figure 9:
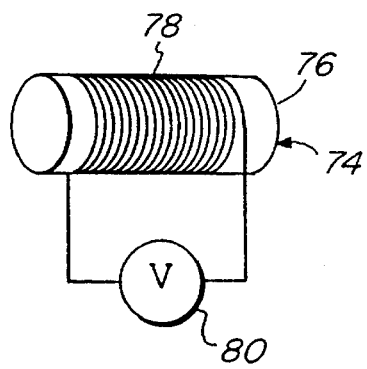
FIG. 9 is a schematic view of a magnetic sensor embodying the present invention.

As best illustrated in FIG. 9, a magnetic sensor 74 is utilized in preference to the current sensor 50 when the neutral 18 of the cable consists of thin metal tape or laminates (not shown) instead of a neutral wire 18 (as shown in FIGS. 2 and 3). The magnetic sensor 74 is built by winding a wire 78 around a core 76 made of a magnetic or ferromagnetic material.

Figure 10:
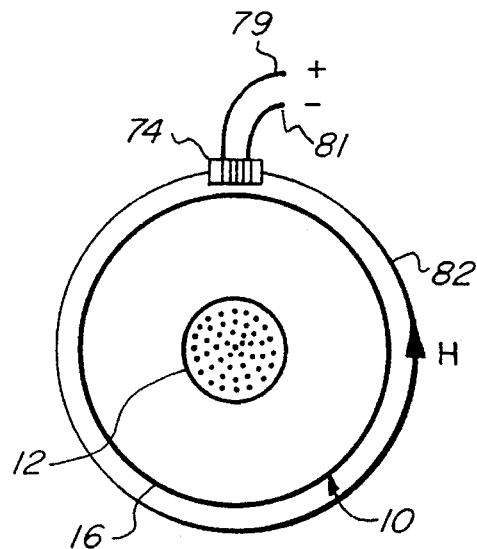
FIG. 10 diagrammatically illustrates the operation of a magnetic sensor on a power line.

As illustrated in FIG. 10, the residual magnetic field 82 created by a PD pulse outside the power line 10 (shown as a circle 82 concentric to the power line 10) produces a magnetic flux (not shown) in the core 76 of the sensor 74. As this flux changes very rapidly with time (within several thousandth of a millionth of a second), it induces a significant voltage 80 in the coil 78 in accordance with Faraday's Law (the voltage is proportional to the time rate of change of the flux). This voltage 80 appears across the positive and negative terminals 79 and 81 of the sensor 74. Since the output of the magnetic sensor 74 is a voltage 80, it does not require the transresistance circuit 84.

Figure 12:
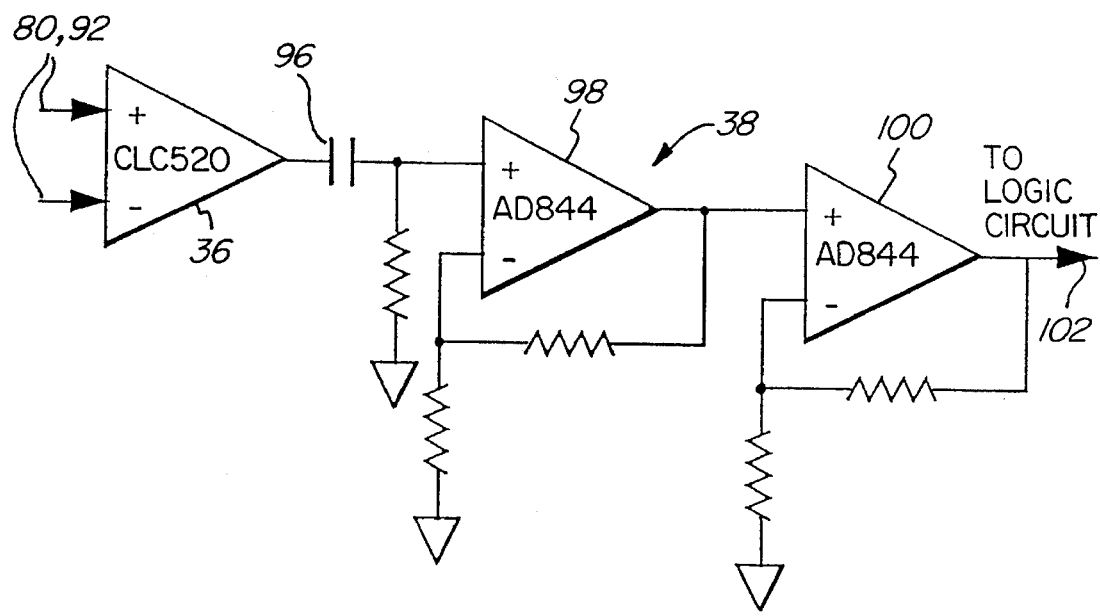
FIG. 12 is a schematic illustration of a voltage signal conditioning circuit.

As illustrated in FIG. 12, the voltage signal 80 or 92 produced by each of the two sensors 30 and 32 is then fed into a signal conditioning circuit 38. The first component of the conditioning circuit 38 is the differential amplifier 36 which subtracts the signal 46 from the signal 44 to produce either a positive or a negative combined signal 48. It is followed by a high pass filter 96 which rejects frequencies lower than a preset frequency (7 Khz for example). The now filtered signal 48 is then fed into two identical amplifiers 98 and 100, each having a gain of 100 and a band width of 5 Mhz.

Figure 13:
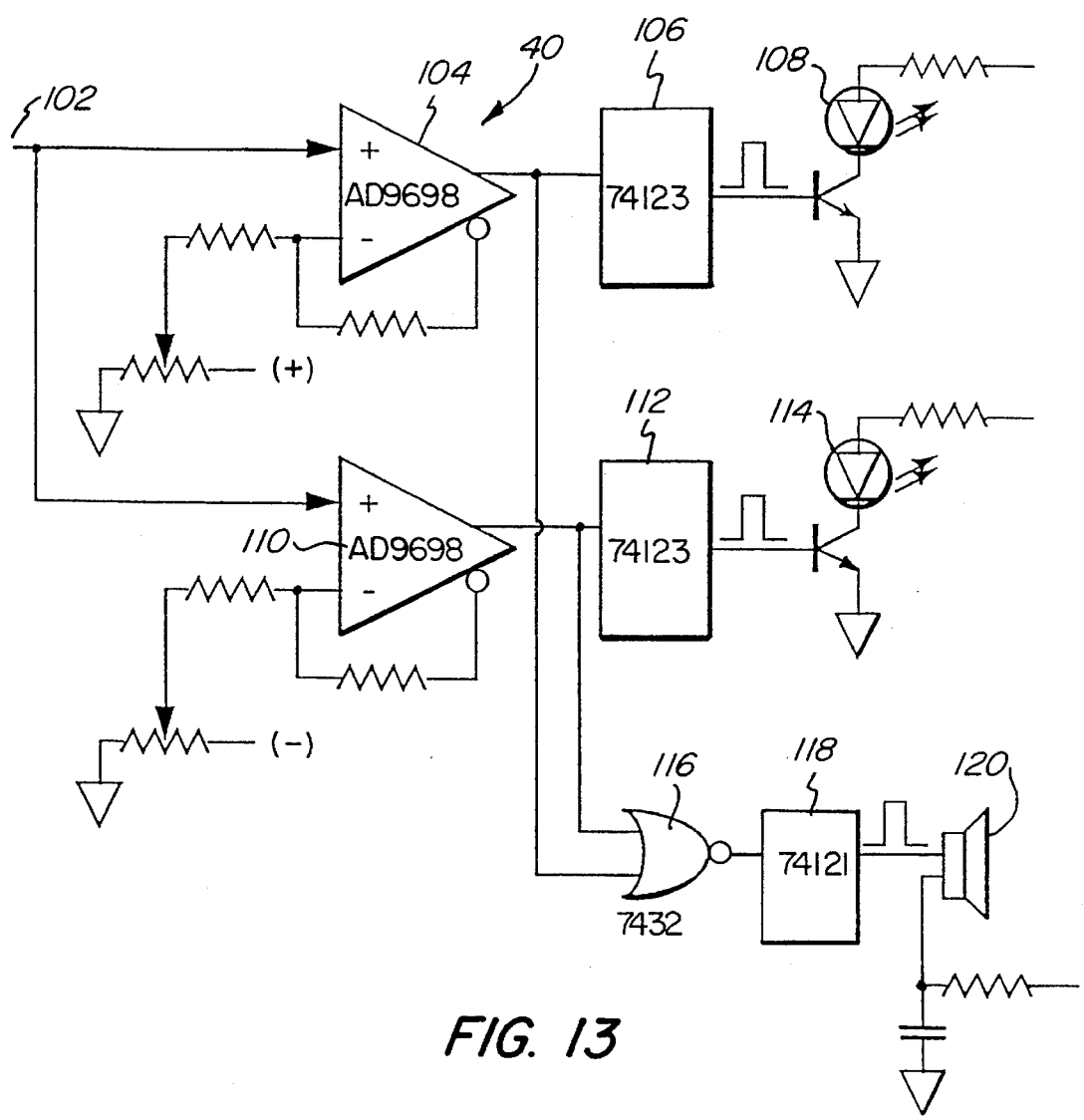
FIG. 13 is a schematic illustration of a logic circuit and displays for use in a sensor apparatus of the present invention.

The output 102 of the signal conditioning circuit 38 is sent to the logic circuit 40, which is best illustrated in FIG. 13. The signal 102 from the signal conditioning circuit 38 (either positive or negative pulse) is taken to two identical AD9698 high speed comparators 104 and 110. Comparator 104 provides an output voltage if the signal is positive and exceeds some adjustable level. Comparator 110 provides an output if the signal is negative and exceeds an adjustable level. The output of the comparators 104 and 110 is then fed to the display 28.

As shown in FIG. 13, the preferred embodiment of pointer 26 utilizes both light emitting diodes (LED's) 108 and 114 as visual displays and a beeper 120 as an audible output. To provide a luminescent visual display, LED 108 is actuated by a multivibrator 106 which responds to the output of the comparator 104 associated with a positive pulse. LED 114 is actuated by multivibrator 112 which in turn responds to the output of the comparator 110 associated with the negative pulse. To provide an audio signal, a beeper 120 is actuated by the multivibrator 118 which responds to either comparator 104 or 110 through an OR logic gate 116, thus triggering the beeper 120 to provide an audible sound whenever a pulse exists, whether positive or negative.

It can be seen that the instrumentation and measurement method of the present invention are nondestructive since the excitation voltage may be at or below the normal surface voltage of the cable system. Accordingly, it need not introduce destructive electrical stresses into the system.

The instrumentation required is designed for field use with cables buried underground, and all measurements may be done on the field installation. As will be appreciated, the sensors may be housed in a metal enclosure which shields them from electrical noise. The bottom cover of the enclosure is left open when current sensors is used, but is closed with a non-magnetic metal, when magnetic sensors are used. The sensor assembly may be attached to a long electrically insulated handle on which the balance of the circuit, housed in a metal enclosure, is mounted. The power supply may be provided by a rechargeable battery.

To protect the operator, the end of the handle closest to the operator may be separated from the circuit enclosure by a metal sleeve which is electrically connected to the grounded neutral of the cable. Should any high voltage leak from the cable, it would be conducted directly to the ground and avoid passage to the operator.

Thus, it can be seen that the method and the apparatus of the present invention provide an effective means for determining the location of an incipient fault in a power line accurately enough to locate the site of the defect within the distance normally required by cable repair. The apparatus is of relatively simple construction and the method is relatively simple, nondestructive and readily employed.

Having thus described the invention, what is claimed is:

1. A method for detecting the location of a partial discharge produced by an incipient fault in an insulated power line comprising the steps of:

(a) applying an excitation voltage to a power line to produce a partial discharge signal pulse at an incipient fault along said power line;

(b) scanning the surface of said power line with two isolated axially spaced sensors disposed adjacent the surface of said power line, said sensors detecting said partial discharge signal pulse to produce discrete detected pulses which are transmitted to different input terminals of a differential amplifier;

(c) combining said detected pulses to produce a combined signal having an amplitude level that reaches an extreme value when said point of partial discharge produced by said fault is located equidistantly between said sensors; and (d) moving said sensors along said power line and repeating steps (a) through (c) until the point of partial discharge provided by said fault is located substantially equidistantly between said sensors as indicated by said extreme amplitude level of said combined signal.

2. The method for locating an incipient fault in accordance with claim 1 wherein there are included the steps of:

(a) comparing said amplitude level of said combined signal with a predetermined signal amplitude level; and (b) producing a comparison output signal if said amplitude level of said combined signal equals said predetermined signal amplitude level.

3. The method for locating an incipient fault in accordance with claim 2 wherein said comparison output signal operates a signalling device.

4. The method for locating an incipient fault in accordance with claim 1 wherein there are included the steps of:
 (a) passing said combined signal through a high pass filter that rejects any frequencies lower than a predetermined frequency level to produce a filtered signal; and
 (b) amplifying said filtered signal to produce an amplified signal.

5. The method for locating an incipient fault in accordance with claim 1 wherein said pulses detected by said sensors are of opposite polarity when said fault is located between said sensors.

6. The method for locating an incipient fault in accordance with claim 5 wherein said combining step includes subtracting said pulses detected by one sensor from said pulses detected by the other sensor to produce a combined signal.

7. The method for locating an incipient fault in accordance with claim 1 wherein said pulses detected by said sensors are voltage pulses.

8. The method for locating an incipient fault in accordance with claim 1 wherein said pulses detected by said sensors are current pulses.

9. The method for locating an incipient fault in accordance with claim 8 wherein there is included the step of converting said detected current pulses to discrete voltage pulses.

10. Apparatus for detecting the location of a partial discharge produced by an incipient fault in an associated insulated power line comprising:
 (a) means for applying an excitation voltage to an associated power line to produce a partial discharge signal pulse at a fault along the associated power line;
 (b) means for scanning the surface of said associated power line including two spaced and isolated sensors adapted to be disposed in axially spaced relationship adjacent the surface of the associated power line, said sensors being adapted to detect the partial discharge signal pulses and produce discrete detected pulses;
 (c) means for combining said detected pulses including a differential amplifier with separate terminals for receiving and processing the signal pulses from said sensors, said means for combining said detected pulse functioning to produce a combined signal having an amplitude level that reaches an extreme value when the point of partial discharge produced by the fault is located equidistantly between said sensors.

11. The apparatus for detecting the location of an incipient fault in accordance with claim 10 further including:
 (a) means for comparing said amplitude level of said combined signal with a predetermined signal amplitude level;
 (b) means for producing a comparison output signal if said amplitude level of said combined signal equals said predetermined signal amplitude level; and
 (c) a signalling device operable by said comparison output signal.

12. The apparatus for detecting the location of an incipient fault in accordance with claim 10 wherein said sensors are of arcuate configuration providing ends and dimensioned to partially encircle the periphery of the associated power line, each of said sensors including a layer of insulating material to be disposed adjacent the surface of the associated power line, a layer of electrically conducting material disposed upon said insulating layer, two electrical output terminals, and means for releasably electrically connecting said ends of each of said sensors together to encircle the periphery of the associated power line whereby the partial discharge pulse induces a current in said conducting layer that may be conducted from said output terminals.

13. The apparatus for detecting the location of an incipient fault in accordance with claim 12 further including means for converting said induced current conducted from said output terminals to a voltage.

14. The apparatus for detecting the location of an incipient fault in accordance with claim 12 wherein said layer of electrically conducting material includes a multiplicity of axially spaced wires, said spaced wires being connected and said sensors being adapted to dispose said wires substantially concentric with the center of the associated power line.

15. The apparatus for detecting the location of an incipient fault in accordance with claim 12 wherein said layer of electrically conducting material includes a flexible sheet of electrical conducting material and said sensor being adapted to dispose said sheet substantially concentric with the center of the associated power line.

16. The apparatus for detecting the location of an incipient fault in accordance with claim 12 wherein each of said sensors includes a layer of magnetic material disposed between said layer of electrically conducting material and the associated cable.

17. The apparatus for detecting the location of an incipient fault in accordance with claim 10 wherein each of said sensors includes:
 (a) a core having magnetic properties;
 (b) an electrical conductor disposed upon said core, said electrical conductor having two terminals whereby the partial discharge pulse will create a residual magnetic field outside the associated power line, and the residual magnetic field will produce a magnetic flux in said core of said sensor that induces a voltage in said electrical conductor that appears across said terminals.

18. The apparatus for detecting the location of an incipient fault in accordance with claim 10 wherein said means for combining said detected pulses includes:
 (a) a differential amplifier for subtracting one of said detected pulses from the other of said detected pulses to produce said combined signal;
 (b) a high pass filter connected to said differential amplifier and through which said combined signal is passed and that rejects any frequencies lower than a predetermined frequency level and produces a filtered signal; and
 (c) an amplifier for amplifying said filtered signal to produce an amplified signal.

19. The apparatus for detecting the location of an incipient fault in accordance with claim 11 wherein said means for producing a comparison output signal includes first and second comparators, said first comparitor producing said comparison output signal if said amplitude level of said combined signal is negative and exceeds a negative predetermined signal amplitude level, said second comparitor producing said comparison output signal if said amplitude level of said combined signal is positive and exceeds a positive predetermined signal amplitude level.

20. The apparatus for detecting the location of an incipient fault in accordance with claim 11 wherein said signalling device includes:
 (a) a multivibrator triggerable by said comparison output signal; and (b) a light emitting diode actuatable by said multivibrator.

21. The apparatus for detecting the location of an incipient fault in accordance with claim 19 wherein said signalling device includes:

(a) first and second multivibrators, said first multivibrator being operable by said comparison output signal of said first comparator, said second multivibrator being operable by said second comparator output signal; and (b) first and second light emitting diodes, said first diode being actuatable by said first multivibrator, said second diode being actuatable by said second multivibrator.

22. The apparatus for detecting the location of an incipient fault in accordance with claim 11 wherein said signalling device includes:

(a) a multivibrator operatable by said comparison output signal; and (b) an audio beeper actuatable by said multivibrator.

23. The apparatus for detecting the location of an incipient fault in accordance with claim 21 wherein said signalling device includes:

(a) a multivibrator operatable by said comparison output signal; and (b) an audio beeper actuatable by said multivibrator.

* * * * *